US012615887B2

(12) United States Patent
Teng et al.

(10) Patent No.: US 12,615,887 B2
(45) Date of Patent: Apr. 28, 2026

(54) LIGHT-EMITTING DIODE

(71) Applicant: KAISTAR Lighting (Xiamen) Co., Ltd, Xiamen (CN)

(72) Inventors: ShuenTa Teng, Xiamen (CN); Hung-Chih Yang, Xiamen (CN); Chunyu Liu, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 447 days.

(21) Appl. No.: 18/346,271

(22) Filed: Jul. 3, 2023

(65) Prior Publication Data

US 2024/0006556 A1    Jan. 4, 2024

(30) Foreign Application Priority Data

Jul. 4, 2022    (CN) .......................... 202210846345.3

(51) Int. Cl.
| | |
|---|---|
| *H01L 33/32* | (2010.01) |
| *H10H 20/812* | (2025.01) |
| *H10H 20/816* | (2025.01) |
| *H10H 20/825* | (2025.01) |

(52) U.S. Cl.
CPC ...... *H10H 20/8252* (2025.01); *H10H 20/812* (2025.01); *H10H 20/8162* (2025.01)

(58) Field of Classification Search
CPC ............. H10H 20/8252; H10H 20/812; H10H 20/8162; H10H 20/825; H10H 20/816
See application file for complete search history.

(56) References Cited

U.S. PATENT DOCUMENTS

| | | | |
|---|---|---|---|
| 2010/0219395 A1 | 9/2010 | Hirayama | |
| 2021/0217925 A1* | 7/2021 | Inoue | ................. H10H 20/8215 |
| 2022/0336693 A1* | 10/2022 | Inazu | .................. H10H 20/824 |

FOREIGN PATENT DOCUMENTS

| | | | |
|---|---|---|---|
| CN | 104377283 A | 2/2015 | |
| CN | 106981548 A | 7/2017 | |
| CN | 109920890 A | 6/2019 | |
| CN | 111883623 A | * 11/2020 | ......... H10H 20/8252 |

OTHER PUBLICATIONS

Machine translation of CN-111883623-A (Year: 2020).*

* cited by examiner

*Primary Examiner* — Mohammed R Alam
(74) *Attorney, Agent, or Firm* — Hemisphere Law, PLLC

(57)    ABSTRACT

A light-emitting diode includes an N-type semiconductor layer, a light-emitting layer, a first P-type semiconductor layer, a hole diffusion layer and a second P-type semiconductor layer sequentially stacked in that order. The hole diffusion layer includes a first sub-layer, a second sub-layer and a third sub-layer sequentially stacked along a direction from the first P-type semiconductor layer to the second P-type semiconductor layer. The first sub-layer is an AlN layer, the second sub-layer is an AlInGaN layer or an AlGaN layer, and the third sub-layer is an AlInGaN layer or an AlGaN layer. As a result, advantages of alleviating a current crowding problem and improving luminous efficiency can be achieved.

16 Claims, 3 Drawing Sheets

LIGHT-EMITTING DIODE

TECHNICAL FIELD

The disclosure relates to the field of light-emitting semiconductors, and more particularly to a light-emitting diode.

BACKGROUND

A light-emitting diode (LED) has advantages of small size and long life, and thus the LED is widely used in various fields. With the limited resources on the earth, it is necessary to spend less electricity to get higher brightness, and therefore how to improve luminous efficiency of the LED has become a more important issue. A P-type semiconductor in the LED is prone to current crowding, resulting in an increase of turn-on voltage of the LED and a decrease of luminous efficiency, and therefore, how to make the P-type semiconductor get good current diffusion has become a problem urgently to be solved.

Therefore, there is a need of providing a solution to address the above-mentioned current crowding problem.

SUMMARY

To overcome at least some of shortcomings in the related art, embodiments of the disclosure provide a light-emitting diode (LED), which has characteristics of alleviating the current crowding problem and improving the luminous efficiency of LED.

Specifically, in an aspect, an embodiment of the disclosure provides a light-emitting diode, including: an N-type semiconductor layer, a light-emitting layer, a first P-type semiconductor layer, a hole diffusion layer and a second P-type semiconductor layer sequentially stacked in that order. The hole diffusion layer includes a first sub-layer, a second sub-layer and a third sub-layer sequentially stacked along a direction from the first P-type semiconductor layer to the second P-type semiconductor layer. The first sub-layer is an AlN layer, the second sub-layer is an AlInGaN layer or an AlGaN layer, and the third sub-layer is an AlInGaN layer or an AlGaN layer.

In another aspect, another embodiment of the disclosure provides a light-emitting diode, including an N-type semiconductor layer, a light-emitting layer and a P-type semiconductor layer sequentially stacked in that order, and further including a hole diffusion layer located between the light-emitting layer and the P-type semiconductor layer. The hole diffusion layer includes a first sub-layer, a second sub-layer and a third sub-layer sequentially stacked along a direction from the light-emitting layer to the P-type semiconductor layer. The first sublayer is an undoped AlN layer, the second sub-layer is an undoped AlInGaN layer or an undoped AlGaN layer, and the third sub-layer is an undoped AlInGaN layer or an undoped AlGaN layer.

The above embodiments of the disclosure may achieve one or more of the following beneficial effects. In particular, by adding the hole diffusion layer between the light-emitting layer and the P-type semiconductor layer, a particular structure of the hole diffusion layer can change paths of holes to prevent the holes from being crowded in the same position, thereby achieving the effect of current diffusion and thus improving the luminous efficiency of LED.

Other aspects and features of the disclosure will become apparent from the detailed description with reference to the accompanying drawings. However, it should be understood that the drawings are designed only for the purpose of illustration and are not intended as a limitation of the scope of the disclosure. It should also be understood that unless otherwise specified, the drawings are not necessarily drawn to scale, and are merely intended to conceptually illustrate structures and procedures described herein.

BRIEF DESCRIPTION OF DRAWINGS

Embodiments of the disclosure will be described in detail with reference to the accompanying drawings.

DESCRIPTION OF REFERENCE NUMERALS

10: light-emitting diode; 11: N-type semiconductor layer; 12: light-emitting layer; 13: electron blocking layer; 14: P-type semiconductor layer; 15: hole diffusion layer; 141: first P-type semiconductor layer; 142: second P-type semiconductor layer; 151: first sub-layer; 152: second sub-layer; 153: third sub-layer; 154: fourth sub-layer; 1541: AlGaN layer; 1542: GaN layer.

DETAILED DESCRIPTION OF EMBODIMENTS

In order to make the above purposes, features and advantages of the disclosure more apparent and understandable, specific embodiments of the disclosure will be described in detail in combination with the accompanying drawings.

It should also be noted that a division of multiple embodiments in the disclosure is only for the convenience of description and should not constitute a special limitation, and features in various embodiments may be combined and referenced mutually on the prerequisite of without contradiction.

Figure 1:
FIG. 1 is a schematic structural view of a light-emitting diode according to an embodiment of the disclosure.
Figure 2:
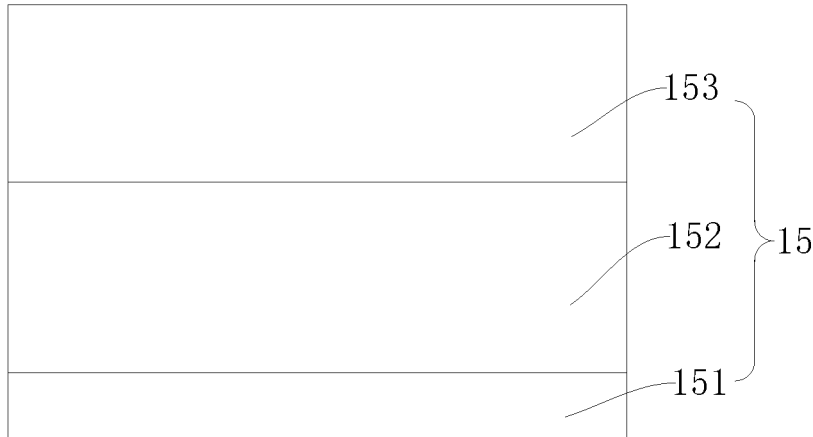
FIG. 2 is a schematic structural view of a hole diffusion layer of the light-emitting diode shown in FIG. 1 according to an embodiment of the disclosure.

Referring to FIG. 1, FIG. 1 illustrates a schematic structural view of a light-emitting diode 10 according to an embodiment of the disclosure. The light-emitting diode 10 includes an N-type semiconductor layer 11, a light-emitting layer 12 and a P-type semiconductor layer 14 sequentially stacked in that order, and further includes a hole diffusion layer 15 located between the light-emitting layer 12 and the P-type semiconductor layer 14. Referring to FIG. 2, the hole diffusion layer 15 includes a first sub-layer 151, a second sub-layer 152 and a third sub-layer 153 sequentially stacked along a direction from the light-emitting layer 12 to the P-type semiconductor layer 14. Specifically, the first sub-layer 151 is, for example, an aluminum nitride (AlN) layer. The second sub-layer 152 is, for example, an aluminum indium gallium nitride (AlInGaN) layer or an aluminum gallium nitride (AlGaN) layer. The third sub-layer 153 is, for example, an AlInGaN layer or an AlGaN layer. More specifically, in an exemplary embodiment, the first sub-layer 151 is the AlN layer, the second sub-layer 152 and the third sub-layer 153 each are the AlInGaN layer. In another exemplary embodiment, the first sub-layer 151 is the AlN layer, the second sub-layer 152 and the third sub-layer 153 each are the AlGaN layer. In still another exemplary embodiment, the first sub-layer 151 is the AlN layer, the second sub-layer 152 is the AlInGaN layer, and the third sub-layer 153 is the AlGaN layer. In even still another exemplary embodiment, the first sub-layer 151 is the AlN layer, the second sub-layer is the AlGaN layer, and the third sub-layer is the AlInGaN layer. In other words, each of the first sub-layer 151, the second sub-layer 152 and the third sub-layer 153 is a single-layered sub-layer.

The N-type semiconductor layer 11 of the light-emitting diode 10 as provided in the illustrated embodiment is usually an N-type gallium nitride (GaN) layer, and a material thereof is usually silicon-doped (Si-doped) gallium nitride material. In some embodiments, the light-emitting layer 12 is a multiple quantum well (MQW) structure layer typically including alternately stacked InGaN layers and GaN layers. In some embodiments, the light-emitting diode 10 further includes, for example, a substrate layer, a low-temperature buffer layer, an u-type (i.e., undoped type) GaN layer and a stress adjustment layer sequentially stacked on a side of the N-type semiconductor layer 11 facing away from the light-emitting layer 12. In some embodiments, the light-emitting diode 10 further includes, for example, an N electrode and a P electrode, the N electrode is electrically connected to the N-type semiconductor layer 11, and the P electrode is electrically connected to the P-type semiconductor layer 14. Such settings of additional layers for the light-emitting diode 10 can refer to existing light-emitting diodes, and thus will not be described in detail herein. In an illustrated embodiment, the P-type semiconductor layer 14 is usually a P-type GaN layer, and a material thereof is usually a magnesium-doped (Mg-doped) gallium nitride material. In some embodiments, the P-type semiconductor layer includes, for example, a first P-type semiconductor layer 141 and a second P-type semiconductor layer 142. Generally, in order to obtain better crystalline quality, a growth temperature of the P-type semiconductor layer is needed to be relatively higher, but the higher growth temperature will affect a crystal structure of the light-emitting layer; and therefore, a layer of low-temperature P-GaN grown at a relatively low temperature, i.e., the first P-type semiconductor layer 141 in the illustrated embodiment, may be formed on a side adjacent to the light-emitting layer. Although the first P-type semiconductor layer 141 and the second P-type semiconductor layer 142 have different growth temperatures, materials thereof each are Mg-doped GaN. The hole diffusion layer 15 is, for example, located between the first P-type semiconductor layer 141 and the second P-type semiconductor layer 142.

As mentioned above, the P electrode is electrically connected to the P-type semiconductor layer 14, and when the light-emitting diode 10 is powered on, current flows from the P electrode into the P-type semiconductor layer 14, as holes move in the P-type semiconductor layer toward the light-emitting layer 12, the P-type semiconductor layer 14 may encounter a problem of being with different distances from the electrode, or uneven impedance distribution caused by internal crystal quality defects, since the flow of current (i.e., movement of holes) has a characteristic that it usually concentrate in paths with low impedances, and therefore, a current crowding problem is easily to occur, resulting in an increase of turn-on voltage and thereby the decrease of luminous efficiency. In the illustrated embodiment, the hole diffusion layer 15 is disposed in the P-type semiconductor layer 14, and the hole diffusion layer 15 contains multiple (i.e., more than one) sub-layers with Al component and thus has a relatively high energy barrier. When the light-emitting diode 10 as provided in the illustrated embodiment is working, holes may be injected starting from the second P-type semiconductor layer 142, after assisted by current diffusion of the hole diffusion layer 15, flow through the first P-type semiconductor layer 141 more evenly, and then enter the light-emitting layer 12 to participate in light emission. During the movement of holes, a certain energy barrier is formed in the middle of the P-type semiconductor layer 14 through the high concentration of Al, which can change movement paths of the holes so that the holes are diffused rather than concentrated in a certain path, thus reducing the occurrence of current crowding.

More specifically, the first sub-layer 151, the second sub-layer 152 and the third sub-layer 153 are all undoped layers, i.e., the first sub-layer 151 is an undoped AlN layer, and the second sub-layer 152 and the third sub-layer 153 each are an undoped AlInGaN layer or an undoped AlGaN layer. According to the prior art, all semiconductor layers on a side which the P-type semiconductor layer 14 is located should be P-doped materials to facilitate the transportation of holes. In experimental processes of the disclosure, it has been found that by setting the hole diffusion layer 15 with undoped materials, it not only can improve the brightness, but also can decrease the voltage and improve the overall luminous efficiency. Please refer to Table 1 as follows for details.

TABLE 1

| Differences of chip voltage and brightness on conditions of the hole diffusion layer with or without being doped | | |
|---|---|---|
| Comparative experiments | Voltage (V) | Brightness (mW) |
| Mg-doped hole diffusion layer | 2.891 | 251.2 |
| | 2.884 | 251.6 |
| Undoped hole diffusion layer | 2.883 | 252.8 |
| | 2.878 | 252.8 |

The reason may be that Mg in Mg-doped material is easy to combine with $H_2$ in a growth process to thereby form a magnesium-hydrogen (Mg—H) material with high impedance, and it is difficult to ensure that all Mg—H bonds are broken in an existing annealing process, so that a problem of voltage rise occurs. In addition, Mg itself has some light-absorption characteristics, which will also have some impact on the brightness. When the first sub-layer 151, the second sub-layer 152 and the third sub-layer 153 are all the undoped layers, the probability of occurrence of Mg—H high impedance can be reduced and the problem of light-absorption can be avoided, thereby effectively reducing the turn-on voltage and improving the brightness of the light-emitting diode.

Figure 4:
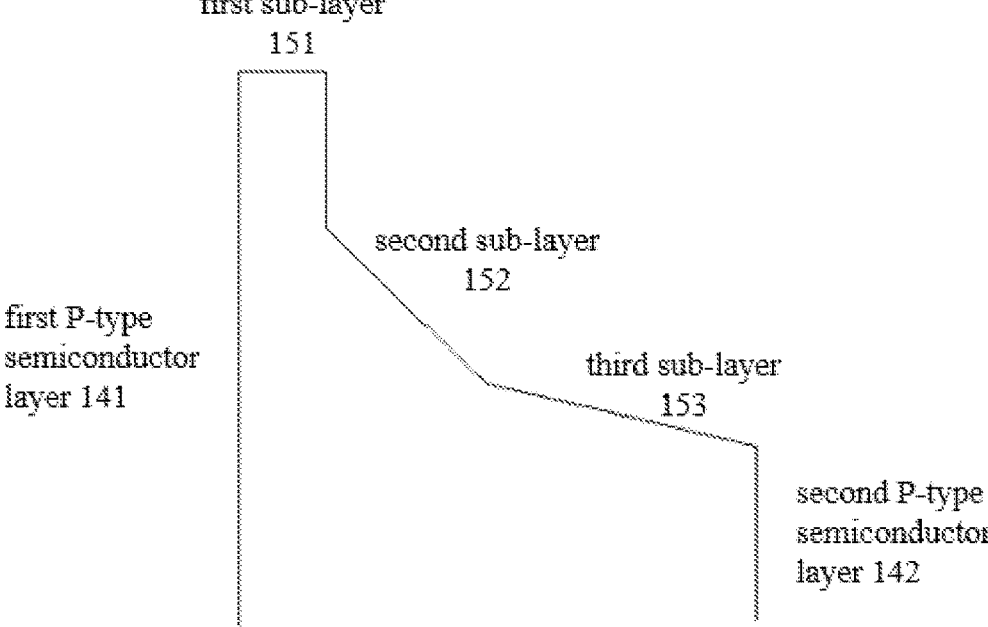
FIG. 4 is a schematic bandgap diagram of the hole diffusion layer shown in FIG. 2.

In some embodiments, Al concentrations in the first sub-layer 151, the second sub-layer 152 and the third sub-layer 153 are sequentially decreased in that order. Specifically, the Al concentration of the first sub-layer 151 is the largest, for example, $1\times10E+19$ to $1\times10E+21$ atoms per cubic centimeter ($atom/cm^3$). Referring to FIG. 4, FIG. 4 illustrates a schematic bandgap diagram of the light-emitting diode 10 shown in FIG. 2. In a direction from the P-type semiconductor layer 14 to the light-emitting layer 12, the Al concentrations are increased and bandgaps becomes larger gradually, the Al concentration gradually-changed structure of the hole diffusion layer 15 can match the bandgap of the P-type semiconductor layer 14 and realize the effect of hole acceleration. When the second sub-layer 152 and the third sub-layer 153 are both AlInGaN layers, indium (In) concentrations of the second sub-layer 152 and the third sub-layer 153 are equal. When the second sub-layer 152 and the third sub-layer 153 use AlInGaN, compared with the situation of using AlGaN, the In component is added, and the doping of the In component can reduce defects of material and thereby improve the quality of material.

In some embodiments, a thickness of the first sub-layer 151 is less than that of the second sub-layer 152, and the thickness of the first sub-layer 151 is less than that of the third sub-layer 153. Specifically, the thickness of the first sub-layer 151 is in a range of 0.5-2 nanometers (nm), the thickness of the second sub-layer 152 is in a range of 5-20 nm, and the thickness of the third sub-layer 153 is in a range of 5-30 nm. The Al concentration of the first sub-layer 151 is relatively high, so that the current after flowing through the second sub-layer 152 can be diffused again. The first sub-layer 151 is designed to be relatively thin, which can ensure holes tunnel through the first sub-layers 151 while achieving holes diffusion effect, thereby preventing the problem of increasing the turn-on voltage.

Figure 3:
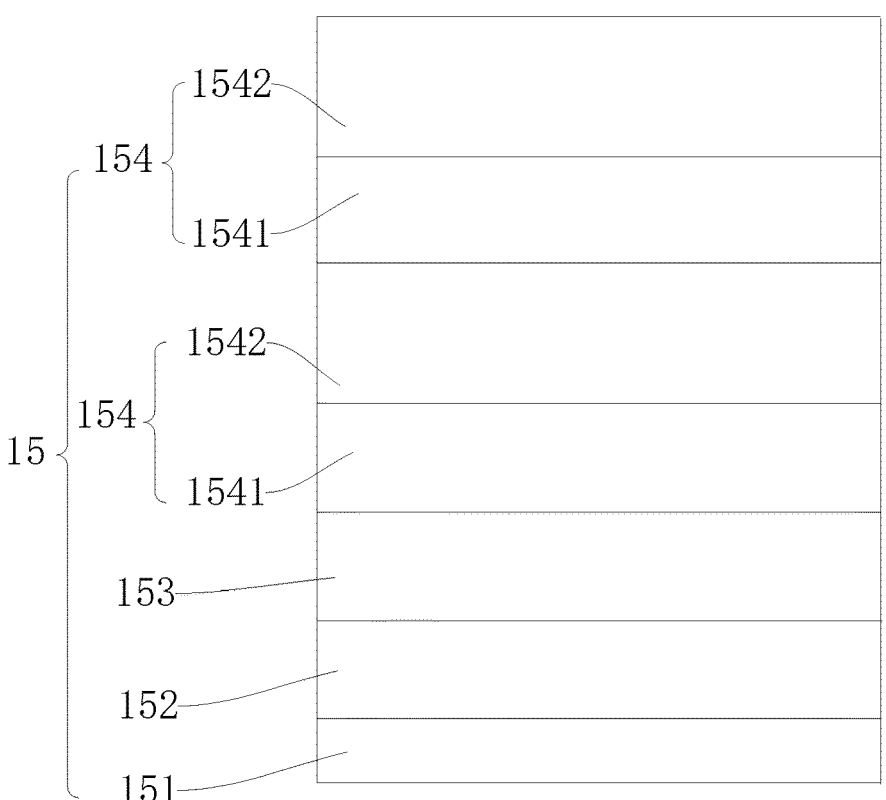
FIG. 3 is a schematic structural view of a hole diffusion layer of the light-emitting diode shown in FIG. 1 according to another embodiment of the disclosure.

In an embodiment of the disclosure, referring to FIG. 3, the hole diffusion layer 15 further includes, for example, at least one fourth sub-layer 154 disposed on a side of the third sub-layer 153 facing away from the second sub-layer 152. Each the fourth sub-layer 154 includes, for example, an AlGaN layer 1541 and an GaN layer 1542 stacked. In other words, the fourth sub-layer 154 is a multi-layered sub-layer. As illustrated in FIG. 3, the fourth sub-layer 154 is located above the third sub-layer 153, and the AlGaN layer 1541 is arranged adjacent to the third sub-layer 153. In some embodiments, a thickness of the AlGaN layer 1541 is, for example, less than that of the GaN layer 1542. In some embodiments, an Al concentration of the fourth sub-layer 154 is lower than the Al concentration of the third sub-layer 153. In the fourth sub-layer 154, a current diffusion function can be realized by the AlGaN layer 1541, and the GaN layer 1542 can prevent the turn-on voltage from being excessively high. Similar to the first sub-layer 151, the second sub-layer 152 and the third sub-layer 153, the fourth sub-layer 154 is, for example, an undoped layer, that is, the AlGaN layer 1541 is an undoped AlGaN layer, and the GaN layer 1542 is an undoped GaN layer, and the term "undoped" herein means being not doped with, for example, Mg, thereby preventing the increase of turn-on voltage.

Figure 5:
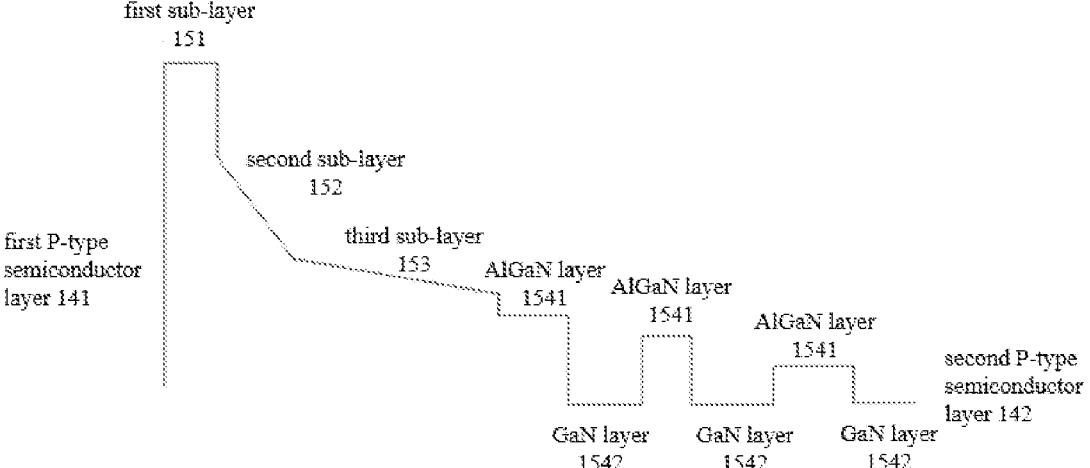
FIG. 5 is a schematic bandgap diagram of a hole diffusion layer according to another embodiment of the disclosure.

In some embodiments, referring to FIG. 3, the hole diffusion layer includes multiple fourth sub-layers 154, for example, two, three or more fourth sub-layers 154. It can be understood that the multiple fourth sub-layers 154 each are an AlGaN/GaN superlattice structure. Since the AlGaN layer 1541 and the GaN layer 1542 are layers of different materials, holes are easily diffused into different paths when passing through the layers of different materials; and therefore, the setting of multiple fourth sub-layers 154 can make the holes be diffused multiple times to thereby increase the current diffusion effect. For example, the two fourth sub-layers 154 shown in FIG. 3 can be understood as a dual-period AlGaN/GaN superlattice structure. In some embodiments, the multiple fourth sub-layers 154 have a same Al concentration. Alternatively, in some embodiments, Al concentrations of the multiple fourth sub-layers 154 are gradually decreased along a direction from the second sub-layer 152 to the third sub-layer 153. Referring to FIG. 5, FIG. 5 illustrates a schematic bandgap diagram of the light-emitting diode 10 with three fourth sub-layers 154 according to an embodiment of the disclosure. Specifically, in the direction from the first sub-layer 151 to the second P-type semiconductor layer 142, the Al concentrations of the respective layers containing Al component in the hole diffusion layer 15 are gradually decreased and thus the bandgap becomes smaller and smaller, so that a relatively better hole diffusion effect can be achieved, and hole acceleration is facilitated.

In some embodiments, in the fourth sub-layer 154, the thickness of the GaN layer 1541 is greater than that of the AlGaN layer 1542, and the thinner AlGaN layer 1542 can ensure providing the hole diffusion effect as well as ensuring the passing of holes. The overall thickness of the fourth sub-layer 154 is, for example, no more than 100 nm. Since the thickness of the fourth sub-layer 154 is positively correlated with the impedance, the thickness of the fourth sub-layer is designed to be as thin as possible in order to reduce the impedance, increase the brightness and reduce the light-absorption effect of Mg—H bonds.

In an embodiment, the light-emitting diode 10 further includes, for example, an electron blocking layer 13, which is located between the light-emitting layer 12 and the P-type semiconductor layer 14. Specifically, the electron blocking layer 13 is located between the light-emitting layer 12 and the first P-type semiconductor layer 141. The light-emitting layer 12 includes alternately stacked InGaN layers and GaN layers, a side of the light-emitting layer 12 adjacent to the electron blocking layer 13 is an undoped GaN layer, and the electron blocking layer 13 is specifically located between the undoped GaN layer and the first P-type semiconductor 141. The undoped GaN layer can be understood as the last layer of the light-emitting layer 12. The electron blocking layer 13 includes, for example, an AlInGaN/InGaN superlattice structure layer and an AlN layer stacked along a direction from the light-emitting layer 12 to the first P-type semiconductor layer 141. Alternatively, in some embodiments, the electron blocking layer 13 includes, for example, a GaN layer and an AlN layer sequentially stacked along the direction from the light-emitting layer 12 to the first P-type semiconductor layer 141. The structure of the electron blocking layer 13 is not limited to the illustrated embodiments. The electron blocking layer 13 usually contains a high concentration of Al and thus has a high energy barrier, so that electrons are not easy to pass therethrough, thereby playing a role of blocking the electrons but not excessively blocking the inflow of holes into the light-emitting layer.

The above description is only some embodiments of the disclosure, and is not intended to limit the disclosure in any form. Although the disclosure has been described in the illustrated embodiments above, it is not intended to limit the disclosure. Any person skilled in the art can use the technical content of the above disclosure to make slight changes or modifications to equivalent embodiments without departing from the scope of the technical solutions of the disclosure, and any simple modification, equivalent change and modification made to the above embodiments according to the technical essence of the disclosure without departing from the technical solutions of the disclosure are still within the scope of the technical solutions of the disclosure.

What is claimed is:

1. A light-emitting diode, comprising an N-type semiconductor layer, a light-emitting layer, a first P-type semiconductor layer, a hole diffusion layer and a second P-type semiconductor layer sequentially stacked in that order;

wherein the hole diffusion layer comprises a first sub-layer, a second sub-layer, and a third sub-layer sequentially stacked in that order along a direction from the first P-type semiconductor layer to the second P-type semiconductor layer; the first sub-layer is an aluminum nitride (AlN) layer, the second sub-layer is one of an aluminum indium gallium nitride (AlInGaN) layer and an aluminum gallium nitride (AlGaN) layer, and the third sub-layer is one of an AlInGaN layer and an AlGaN layer; and wherein the hole diffusion layer further comprises at least one fourth sub-layer disposed on a side of the third sub-layer facing away from the second sub-layer, and each of the at least one fourth sub-layer comprises an AlGaN layer and a GaN layer stacked.

2. The light-emitting diode according to claim 1, wherein each of the first P-type semiconductor layer and the second P-type semiconductor layer is a magnesium-doped (Mg-doped) gallium nitride (GaN) layer.

3. The light-emitting diode according to claim 1, wherein each of the first sub-layer, the second sub-layer and the third sub-layer is an undoped layer.

4. The light-emitting diode according to claim 1, wherein an aluminum (Al) concentration of the first sub-layer, an Al concentration of the second sub-layer and an Al concentration of the third sub-layer are sequentially decreased in that order.

5. The light-emitting diode according to claim 1, wherein a thickness of the first sub-layer is in a range of 0.5 to 2 nanometers (nm), a thickness of the second sub-layer is in a range of 5 to 20 nm, and a thickness of the third sub-layer is a in a range from 5 to 30 nm.

6. The light-emitting diode according to claim 1, wherein the at least one fourth sub-layer of the hole diffusion layer is a plurality of fourth sub-layers, and Al concentrations of the plurality of fourth sub-layers are gradually decreased along a direction from the second sub-layer to the third sub-layer.

7. The light-emitting diode according to claim 1, further comprising an electron blocking layer arranged between the light-emitting layer and the first P-type semiconductor layer, wherein the electron blocking layer comprises an AlInGaN/InGaN superlattice structure layer and an AlN layer stacked in that order along a direction from the light-emitting layer to the first P-type semiconductor layer.

8. The light-emitting diode according to claim 7, wherein the light-emitting layer comprises an InGaN layer and a GaN layer alternately stacked, and a side of the light-emitting layer adjacent to the electron blocking layer is an undoped GaN layer.

9. A light-emitting diode, comprising an N-type semiconductor layer, a light-emitting layer and a P-type semiconductor layer sequentially stacked in that order, and further comprising a hole diffusion layer located between the light-emitting layer and the P-type semiconductor layer;

wherein the hole diffusion layer comprises a first sub-layer, a second sub-layer and a third sub-layer sequentially stacked in that order along a direction from the light-emitting layer to the P-type semiconductor layer; the first sub-layer is an undoped AlN layer, the second sub-layer is one of an undoped AlInGaN layer and an undoped AlGaN layer, and the third sub-layer is one of an undoped AlInGaN layer and an undoped AlGaN layer; and wherein the hole diffusion layer further comprises at least one fourth sub-layer disposed on a side of the third sub-layer facing away from the second sub-layer, and each of the at least one fourth sub-layer comprises an AlGaN layer and a GaN layer stacked.

10. The light-emitting diode according to claim 9, wherein the P-type semiconductor layer comprises a plurality of Mg-doped GaN layers.

11. The light-emitting diode according to claim 9, wherein Al concentrations of the first sub-layer, the second sub-layer and the third sub-layer are sequentially decreased in that order.

12. The light-emitting diode according to claim 9, wherein a thickness of the first sub-layer is in a range of 0.5 to 2 nm, a thickness of the second sub-layer is in a range of 5 to 20 nm, and a thickness of the third sub-layer is a in a range from 5 to 30 nm.

13. The light-emitting diode according to claim 1, wherein the at least one fourth sub-layer of the hole diffusion layer is a plurality of fourth sub-layers, and Al concentrations of the plurality of fourth sub-layers are gradually decreased along a direction from the second sub-layer to the third sub-layer.

14. The light-emitting diode according to claim 9, further comprising an electron blocking layer arranged between the light-emitting layer and the P-type semiconductor layer, wherein the electron blocking layer comprises an AlInGaN/InGaN superlattice structure layer and an AlN layer stacked in that order along a direction from the light-emitting layer to the P-type semiconductor layer.

15. A light-emitting diode, comprising: an N-type semiconductor layer, a multilayer structure, and a light-emitting layer arranged between the N-type semiconductor layer and the multilayer structure;

wherein the multilayer structure comprises: a Mg-doped P-type semiconductor layer, and a hole diffusion layer between the Mg-doped P-type semiconductor layer and the light-emitting layer;

wherein the hole diffusion layer comprises Al-containing sub-layers being not doped with Mg, and Al concentrations of the respective Al-containing sub-layers are gradually decreased along a direction from the light-emitting layer to the Mg-doped P-type semiconductor layer;

wherein the Al-containing sub-layers comprise a plurality of sequentially stacked single-layered sub-layers and at least one multi-layered sub-layer, and the at least one multi-layered sub-layer is located on a side of the plurality of sequentially stacked single-layered sub-layers facing away from the light-emitting layer; and wherein each of the at least one multi-layered sub-layer comprises: a layer of containing Al, and another layer of not containing Al on a side of the layer of containing Al facing away from the light-emitting layer.

16. The light-emitting diode according to claim 15, wherein the multilayer structure further comprises another Mg-doped P-type semiconductor layer having a lower growth temperature than that of the Mg-doped P-type semiconductor layer and arranged between the hole diffusion layer and the light-emitting layer.

* * * * *